US010901055B2

(12) United States Patent
Brunner et al.

(10) Patent No.: US 10,901,055 B2
(45) Date of Patent: Jan. 26, 2021

(54) ACTIVE NOISE SUPPRESSION FOR MAGNETIC RESONANCE BASED MAGNETIC FIELD PROBES

(71) Applicants: Eidgenossische Technische Hochschule (ETH), Zurich (CH); Universitat Zurich, Zurich (CH)

(72) Inventors: David Brunner, Jona (CH); Benjamin Dietrich, Zurich (CH); Klaas Prussmann, Zurich (CH)

(73) Assignees: Eidgenossische Technische Hochschule (ETH); Universitat Zurich

( * ) Notice: Subject to any disclaimer, the term of this patent is extended or adjusted under 35 U.S.C. 154(b) by 0 days.

(21) Appl. No.: 15/573,881

(22) PCT Filed: May 11, 2016

(86) PCT No.: PCT/EP2016/060604
§ 371 (c)(1),
(2) Date: Nov. 14, 2017

(87) PCT Pub. No.: WO2016/184760
PCT Pub. Date: Nov. 24, 2016

(65) Prior Publication Data
US 2018/0292480 A1    Oct. 11, 2018

(30) Foreign Application Priority Data
May 15, 2015 (EP) .................... 15167913

(51) Int. Cl.
*G01R 33/36* (2006.01)
*G01R 33/24* (2006.01)

(52) U.S. Cl.
CPC ......... *G01R 33/3621* (2013.01); *G01R 33/24* (2013.01); *G01R 33/3614* (2013.01)

(58) Field of Classification Search
CPC . G01R 33/3621; G01R 33/24; G01R 33/3614
(Continued)

(56) References Cited

U.S. PATENT DOCUMENTS 4,875,010 A  * 10/1989 Yokosawa .......... G01R 33/0358
                                                324/248
6,424,154 B1 *  7/2002 Young ................ G01R 33/3635
                                                324/309
(Continued)

FOREIGN PATENT DOCUMENTS

EP    2 515 132 A1   10/2012
EP    2 708 908 A1    3/2014

OTHER PUBLICATIONS

Dietrick, B.E., et al., A stand-alone system for concurrent gradient and RF sequence monitoring; Proceedings of the International Society for Magentic Resonance in Medicine, ISMRM 20th Scientific Meeting and Exhibition, Melbourne, Australia 2012, 700.
(Continued)

*Primary Examiner* — Melissa J Koval
*Assistant Examiner* — Rahul Maini
(74) *Attorney, Agent, or Firm* — George Pappas; Barrett McNagny LLP

(57) ABSTRACT

A magnetic resonance (MR) system comprises a main magnetic field and an RF power amplifier for generating an RF field in a first RF band, the arrangement further comprising at least one magnetic field probe (2), said magnetic field probe comprising a MR active probe substance, means for pulsed MR excitation of said probe substance (4) in a second RF band and means for receiving a probe MR signal in the second RF band generated by said probe substance. In order to improve performance of the system, the latter comprises means for recording the output signal of the RF power amplifier in said second RF band, and means for subtracting from said probe MR signal an interfering signal
(Continued)

contribution contained in said recorded RF amplifier output signal.

15 Claims, 11 Drawing Sheets

(58) Field of Classification Search
USPC .......................................... 324/322, 318, 311
See application file for complete search history.

(56) References Cited

U.S. PATENT DOCUMENTS

| | | | | |
|---|---|---|---|---|
| 8,816,684 | B2* | 8/2014 | Walsh | G01R 33/36 |
| | | | | 324/303 |
| 9,547,057 | B2* | 1/2017 | Rearick | G01R 33/3854 |
| 10,175,318 | B2* | 1/2019 | Schmid | G01R 33/422 |
| 2005/0200357 | A1* | 9/2005 | Pruessmann | G01R 33/5611 |
| | | | | 324/309 |
| 2008/0315879 | A1* | 12/2008 | Saha | A61B 5/055 |
| | | | | 324/318 |
| 2010/0074365 | A1 | 3/2010 | Ladebeck et al. | |
| 2013/0162248 | A1* | 6/2013 | Haishi | G01R 33/54 |
| | | | | 324/307 |
| 2016/0069970 | A1* | 3/2016 | Rearick | G01R 33/3806 |
| | | | | 324/309 |

OTHER PUBLICATIONS

De Zanche N, et al., NMR probes for measuring magnetic fields and field dynamics in MR systems; Magn Reson Med 2008, 60(1), 176-186.

Barmet, Christopher et al., Spatiotemporal Magnetic Field Monitoring for MR, Magnetic Resonance in Medicine 2008, 60: 187-197.

Duerst Y, et al., Real-time feedback for spatiotemporal field stabilization in MR systems; Magn Reson Med 2015, 73(2), 884-893.

* cited by examiner

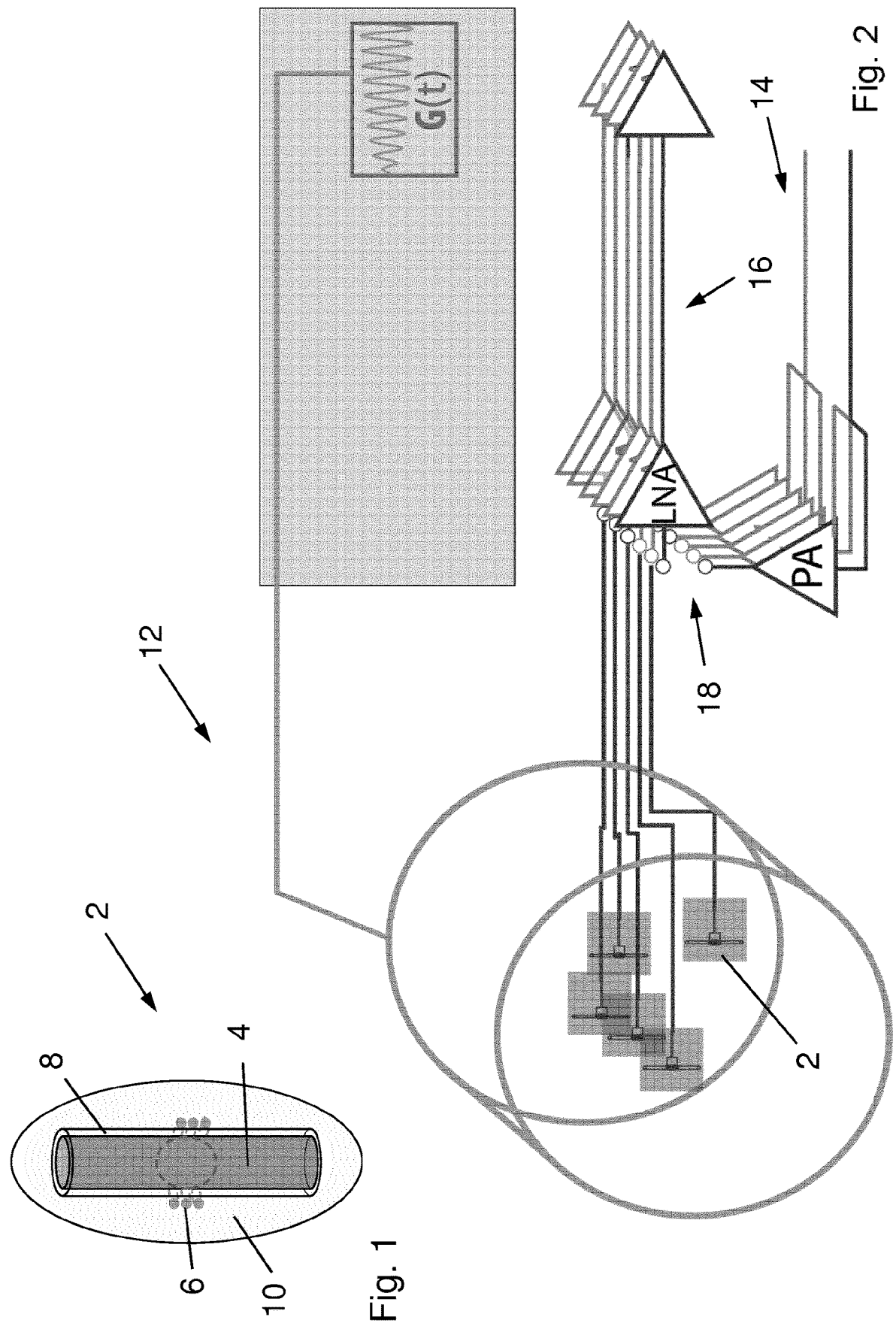

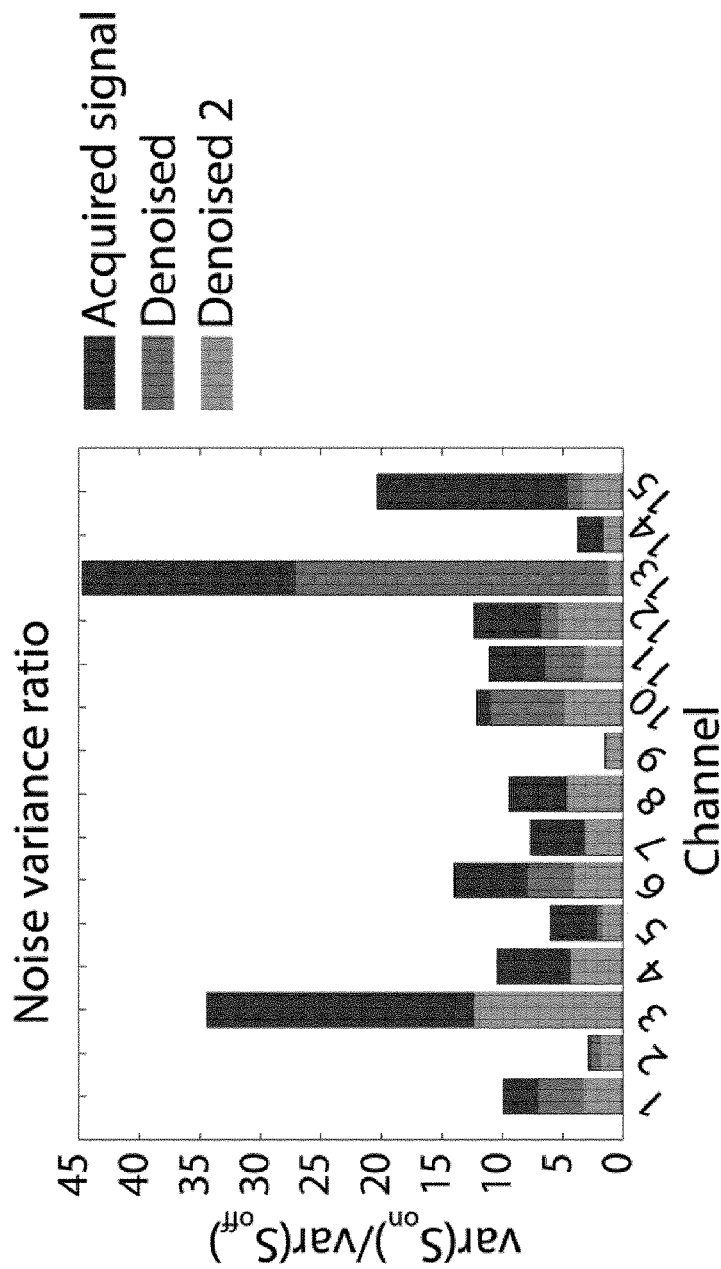
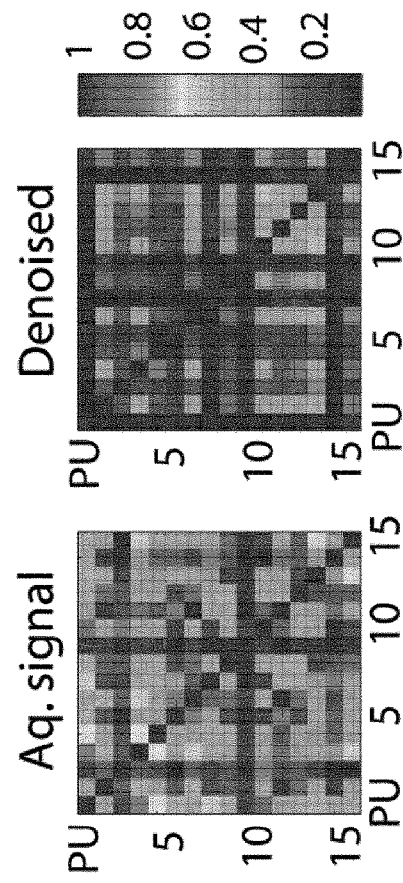
Fig. 7

ACTIVE NOISE SUPPRESSION FOR MAGNETIC RESONANCE BASED MAGNETIC FIELD PROBES

This application claims priority from PCT application No. PCT/EP2016/060604 filed May 11, 2016 which claims priory from European application No. EP 15167913.1 filed on May 15, 2015, the disclosures of which are incorporated herein by reference.

FIELD OF THE INVENTION

The present invention generally relates to a system and a device for improving the signal quality obtained from magnetic resonance (MR) based magnetic field probes during excitation pulses performed in an MR imaging or spectroscopy system.

BACKGROUND OF THE INVENTION

Magnetic field probes based on the observation of an MR signal of a suitable probe substance, henceforth also denoted as "MR based magnetic field probes", offer high sensitivity and bandwidth at high magnetic fields (De Zanche N, Barmet C, Nordmeyer-Massner J A, Pruessmann K P. *NMR probes for measuring magnetic fields and field dynamics in MR systems*. Magri Reson Med 60(1), 176-186, 2008). Further, the phase of the MR signal obtained therefrom represents the field integral over time, which is of special interest in applications of such sensors in MRI and NMR. Therefore the directly measured temporal field integrals do not suffer from error accumulation as it is the case when integrating the signal of a magnetic field sensor of other types such as a Hall device. However, during the acquisition of images and spectra with the host MRI or NMR system, wherein the term "host" shall denote the MR system into which the probes are built in, high power RF pulses in a first RF frequency band are applied, which will affect the signal retrieved from the field probes. For this reason the MR field probes are typically operated on a different MR transition than the actual MR setup and thus operate in a second RF frequency band. In the case on nuclear magnetic resonance (NMR), the probes exploit a different nuclear species than that being examined with the host MR setup. The separation of frequency bands allows separating said two concurrently performed measurements by frequency selective excitations, digital and analogue filtering, as long as the systems' behave substantially linearly and none of the two system emits substantially interfering signals at the frequency of operation of the other system. While a number of measures and provisions such as filters and trapping circuits in the receive chains of the field sensors (see e.g. EP 2515132 A1) and shields (see e.g. EP 2708908 A1) can be taken to avoid that high power RF signals coupled from the NMR system into the probe receive lines destroy, saturate or modulate the receivers of the field probes, strong and broadband noise emitted by the power amplifier's output increases the noise floor of the field sensors and hence lowers critically their precision. Therefore, in the systems described so far, the output of the power amplifier has been filtered at the frequency of operation of the NMR field probes in order to suppress the noise in the retrieved field values. For this purpose high power compatible selective filters had to be used, which are not only costly but finally also introduce losses and distortions to the high fidelity RF pulses used for MRI and NMR.

SUMMARY OF THE INVENTION

It has now been recognized that the noise and spurs emitted by the power amplifier at the frequency of operation of the field probes has to be suppressed from the signal retrieved by the field probes. For this, the signal output of the power amplifier is recorded at least at the frequency of operation of the field sensors. The signal at the output of the power amplifier can be obtained by a coupler at the output of the amplifier, by an antenna, pickup, or coupler in the NMR/MRI transmitter coil, or by recording the signal of at least one field probe which is substantially not producing signal at the current frequency of another probe (as given by the local strength of the magnetic field the MR active part of the field probe is immersed in times the gyromagnetic ratio and chemical shift of the MR active sample) or by recording the signal of the MRI imaging coil at the frequency of operation of the field probes. This recording is then used to digitally subtract the additional noise out of the recorded data from the field sensors which will substantially suppress the noise leakage from the RF power amplifier into the obtained field measurements. For this purpose, the ratios of the noise stemming from the power amplifier in the retrieved data from each field probe and the noise recorded from the power amplifier has to be known in amplitude and phase. This can be measured at installation or in a preparation phase, preferably spectrally resolved within the band the field probe signal is acquired.

Therefore, according to one aspect of the present invention, there is provided a magnetic resonance (MR) system comprising a main magnetic field and an RF power amplifier for generating an RF field in a first RF band, the arrangement further comprising at least one magnetic field probe, said magnetic field probe comprising a MR active probe substance, means for pulsed MR excitation of said probe substance in a second RF band and means for receiving a probe MR signal in the second RF band generated by said probe substance. The system of this invention further comprises:
means for recording the output signal of the RF power amplifier in said second RF band, and
means for subtracting from said probe MR signal an interfering signal contribution contained in said recorded RF amplifier output signal.

It shall be understood that the above mentioned subtracting means can be either analog or digital. They may be incorporated in the neigborhood of the magnetic field probe or they may be part of a processor unit located away from the probe region.

According to another aspect of the present invention, there is provided a method of operating the magnetic resonance system, in which method an interfering signal contribution contained in said RF amplifier output signal is subtracted from a probe MR signal acquired from one of said magnetic field probes.

According to a further aspect of the present invention, there is provided a method for estimating relative coupling factors from at least one transmitter to at least one probe MR signal acquired from a magnetic field probe of a magnetic resonance system, the method comprising the step of cross correlating an interfering signal contribution acquired from any one of said transmitters coil elements with the probe MR signal acquired from any one of said magnetic field probes.

In the present context, the term "interfering signal" shall generally be understood to comprise any undesirable signal contributions such as, most notably, noise and spurs. As well known, the high power RF pulses emitted by an MR scanner to nutate (exciting, inverting, saturating, refocusing) spins in a sample to be examined with the MR system couple into the loop, matching electronics and receiver chains of the MR based field sensors.

In the present context, the terms "first RF band" and "second RF" band are intended to include RF bands that are nominally separated from each other but may have some mutual overlap.

While the strong signals out of the acquisition band of the field probes from the RF pulses of the host MR system can be well suppressed and the receive chain of the field probes is not harmed, nor significantly saturated nor distorted, signals emitted by the high power amplifier out of band of the RF pulses but in the band of operation of the field probes cannot be filtered out. While they are typically too weak to induce non-linear effects into the receive chain of the field probes, especially when the probes are equipped with means for shielding the external power RF fields, they can increase the apparent noise floor by the high and broad-band noise temperature and spurs when coupled into the receive lines.

However, if the noise produced by the RF power amplifier produces is known at least in the band of operation of the field probes it can be subtracted in analog or digital form from the signal retrieved from each probe.

In a preferred embodiment, the signal or signals of the MR scanner's transmitter(s) is/are therefore recorded concurrently with the field probe signals and preferably with the same or larger bandwidth. The signal emitted by the power amplifiers is thereby obtained by using either a (directional-) coupler at the output of the power amplifier or in the one or several of the transmitter coils or a small antenna or pick-up loop which substantially acquires the output signal of the power amplifier. In order to manage the dynamic range to acquire the noise floor in at least the band of operation of the field probes beside the high power signals in the band of operation of the MR image acquisition, it is preferred to employ frequency selective analogue or digital filters to suppress/reduce the signal at least in the band of the power RF pulse.

It is preferred that the phase and group delay differences between the receive lines of the probes and the power amplifier noise are small, compensated and/or corrected for.

In order to effectively suppress the noise coupled into the receive lines of the field probes, the recorded output noise of the transmitter(s) must be weighted to the scale it is present in the field probe signal. This weighting (in magnitude or/and phase) can be estimated by measuring the coupling between the transmitter and the field probe receive lines and the scaling of receiving the output noise. Alternatively the relative coupling ratios between the transmitter and the receive lines of the field probes can be estimated out of the data retrieved. This can be based on a separate calibration acquisition with preferably no other signal present at the calibrated frequency spot or out of the present data set. Preferably these weighting factors should be assessed and applied frequency dependently even within the band of operation of the field probe signals.

Advantageous embodiments are defined in the description below.

According to one embodiment, the recording means comprise at least one pick-up loop or antenna. According to another embodiment, the recording means comprise at least one coupling means (branched line hybrid-, directional coupler, circulator or similar) connected to an output port of the RF power amplifier or to a transmitter coil element of the RF power amplifier.

According to a further embodiment, the recording means comprise a further one of said magnetic field probes.

According to yet another advantageous embodiment, the magnetic field probes further comprise a shield against external high-frequency electromagnetic field irradiation, said shield substantially surrounding the magnetic field probe, said shield having at least one RF contact to the RF ground of the field probe. Advantageously, the shield is configured as described in EP 2708908 A1.

According to one embodiment of the method, the interfering signal contribution is obtained by weighting the recorded RF amplifier output signal with a predefined, spectrally non-constant weighting function or a filter (analogue, Infinite Impulse Response (IIR). Finite Impulse Response (FIR)) representing a similar operation in time-domain.

According to a further embodiment, the interfering signal contribution to be subtracted from a probe MR signal acquired from one of said magnetic field probes is obtained from a further one of said magnetic field probes.

According to another embodiment, the interfering signal contribution is acquired at times when the probe substance of said further magnetic field probe is not generating any probe MR signal.

BRIEF DESCRIPTION OF THE DRAWINGS

The above mentioned and other features and objects of this invention and the manner of achieving them will become more apparent and this invention itself will be better understood by reference to the following description of embodiments of this invention taken in conjunction with the accompanying drawings, wherein FIG. 1 shows a magnetic field probe, in a sectional view;

FIG. 2 shows a traditional field monitoring setup for measuring the magnetic field evolution up to acoustic frequencies, in a schematic view;

FIG. 7 shows the reduction of signal variance achieved in an embodiment with active noise suppression;

DETAILED DESCRIPTION OF THE PREFERRED EMBODIMENTS OF THE INVENTION

Figure 3:
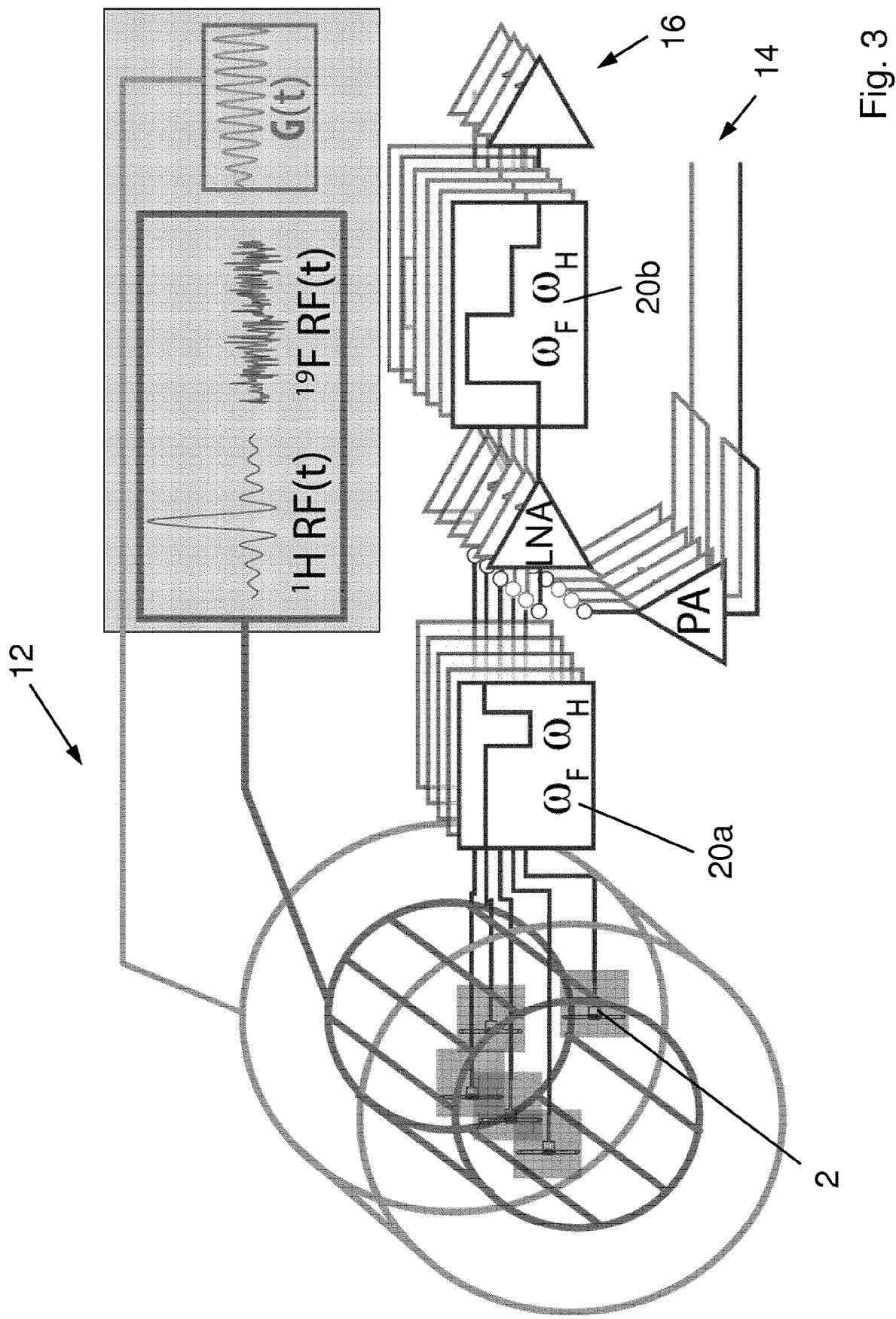
FIG. 3 shows an example of a monitoring setup, in a schematic view.

As can be seen from FIG. 1, a magnetic field probe 2 for magnetic resonance applications comprises a probe substance 4, which is usually a liquid, and it further comprises electrically conductive structure 6 surrounding the detector liquid for receiving therefrom a magnetic resonance signal; and a solid container 8 containing the probe substance. In the example shown, the magnetic field probe 2 further comprises a solid jacket 10 encasing the probe substance 4, container 8 and conductive structure 6. Advantageously, the solid jacket is made of a hardened two-component epoxy system containing a paramagnetic agent dissolved therein. The concentration of the paramagnetic agent can be chosen such that the jacket has a magnetic susceptibility that is substantially identical to the magnetic susceptibility of the conductive structure.

The magnetic field probe may further comprise means for excitation of a magnetic resonance in the detector liquid. In one embodiment this is performed by the same RF current carrying structure which is used for the detection of MR signal emitted by the probe substance.

Further it was recognized to be beneficial to provide means for electrically shielding the field probe with respect to externally interfering RF fields. These means shall preferably not interfere with alternating magnetic fields at lower frequencies (<1 MHz). Such shield means have been described in EP 2708908 A1.

The magnetic field probe is immersed in the magnetic field which shall be measured.

FIG. 2 shows an example of a traditional field monitoring setup for measuring the magnetic field evolution up to acoustic frequencies of e.g. about 1 kHz. Typically, the high power RF transmission of the MRI scanner is turned off during measurement of the magnetic field evoultion. The schematic shows, in green color, the scanner system driving and controlling the magnets for the main, gradient and shim magnetic fields and, in blue color, the field monitoring system comprising the field probes 2, a signal chain 14 for exciting the NMR active sample, a signal chain 16 for receiving the NMR signal and a switch 18 for coupling the field probe either to its exciting or receiving signal chain;

FIG. 3 shows a schematic overview of a monitoring setup which allows monitoring the fields up to acoustic frequencies during high power RF transmission pulses sent by the MRI system and concurrently records the waveform of the RF pulses coupled onto the receive lines of the NMR field probes. This is enabled by frequency selective filters 20a, 20b in the receive lines of the monitoring system.

Figure 4:
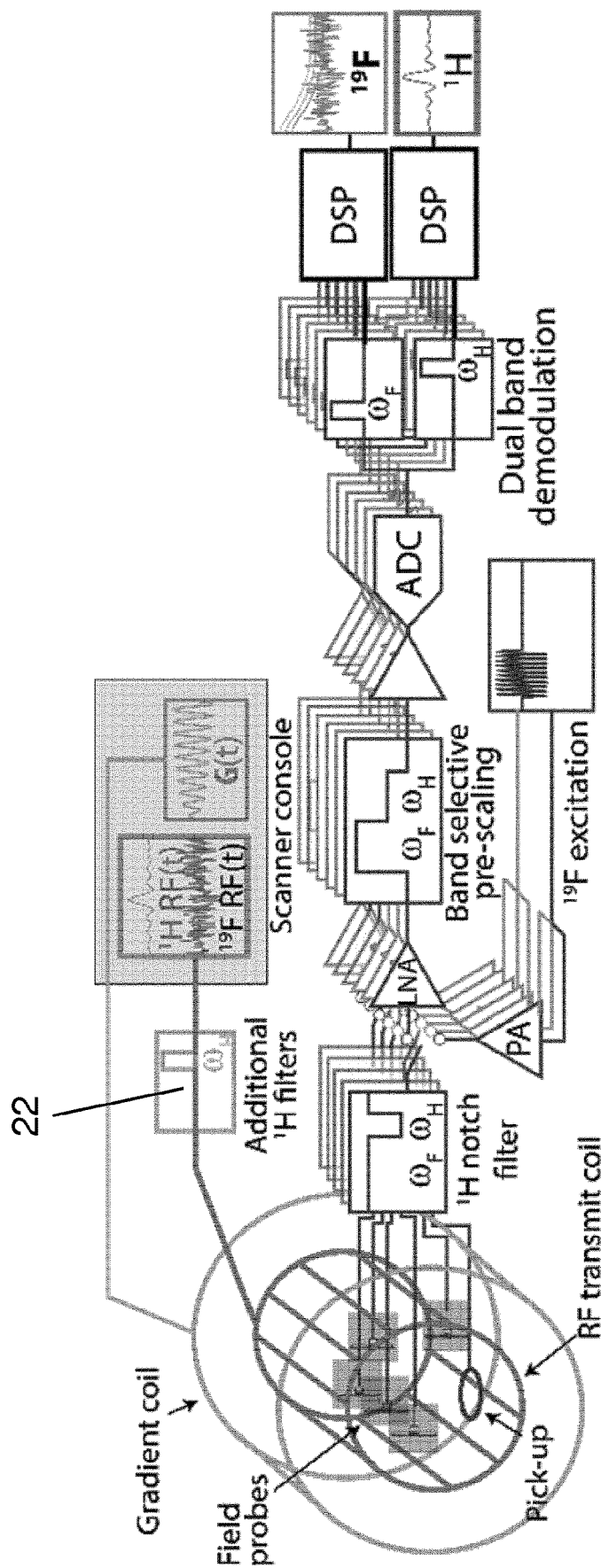
FIG. 4 shows another example of a monitoring setup, in a schematic view.

As shown in FIG. 4, in order to reduce the increase of the noise floor received in the field probes caused by the high noise floor of the power amplifier during transmission, an additional filter 22 is introduced between the output of the power amplifier and the coil passing the actual RF power pulses but stopping the noise on the receive band of the field probes.

Figure 5:
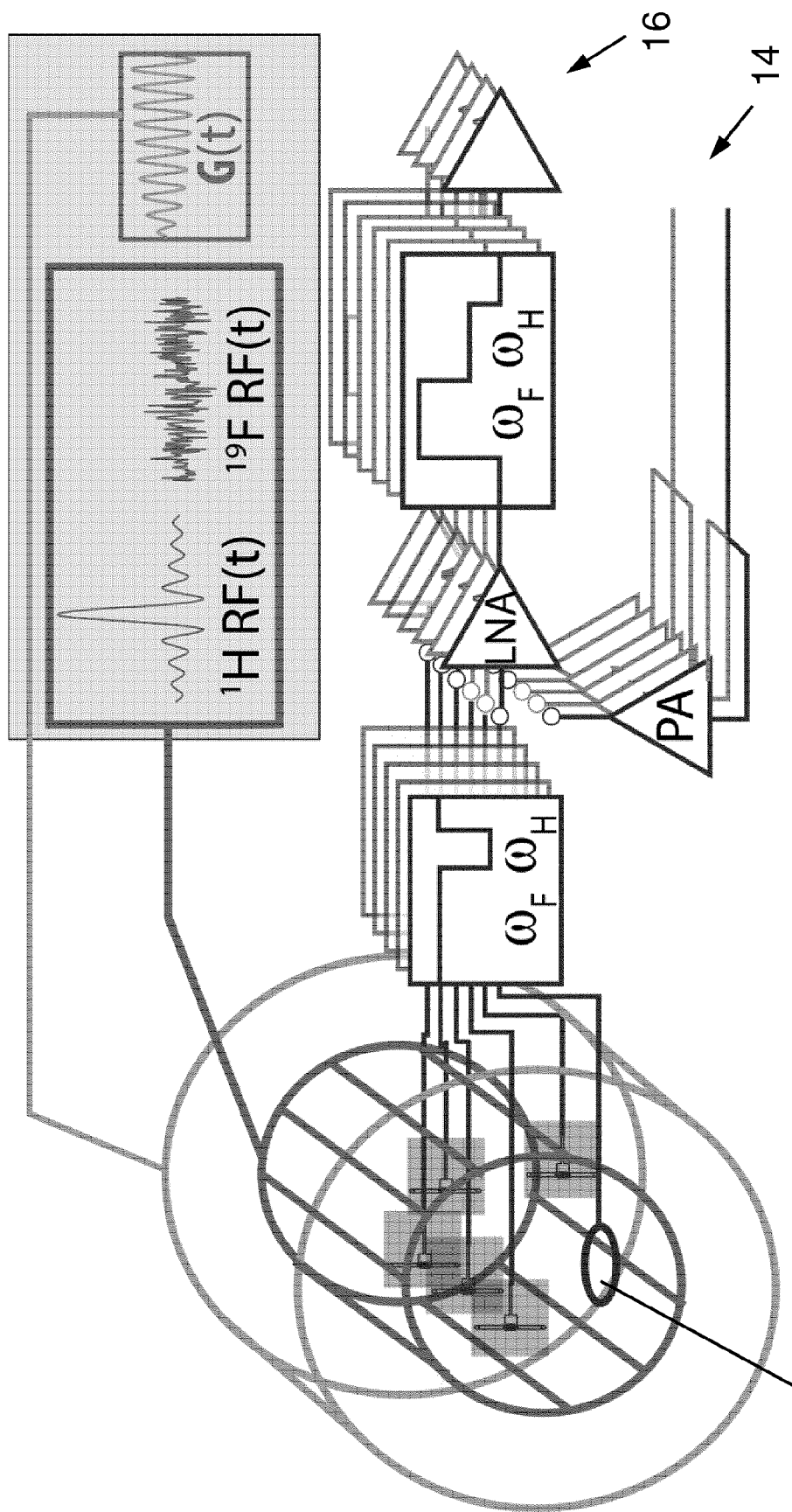
FIG. 5 shows a further example of a monitoring setup, in a schematic view.

FIG. 5 shows a particular embodiment of a field monitoring setup with active power amplifier noise suppression in which the time course of the output signal of the power amplifier is picked up by a loop detector 24 coupled to power RF pulses.

Figure 6:
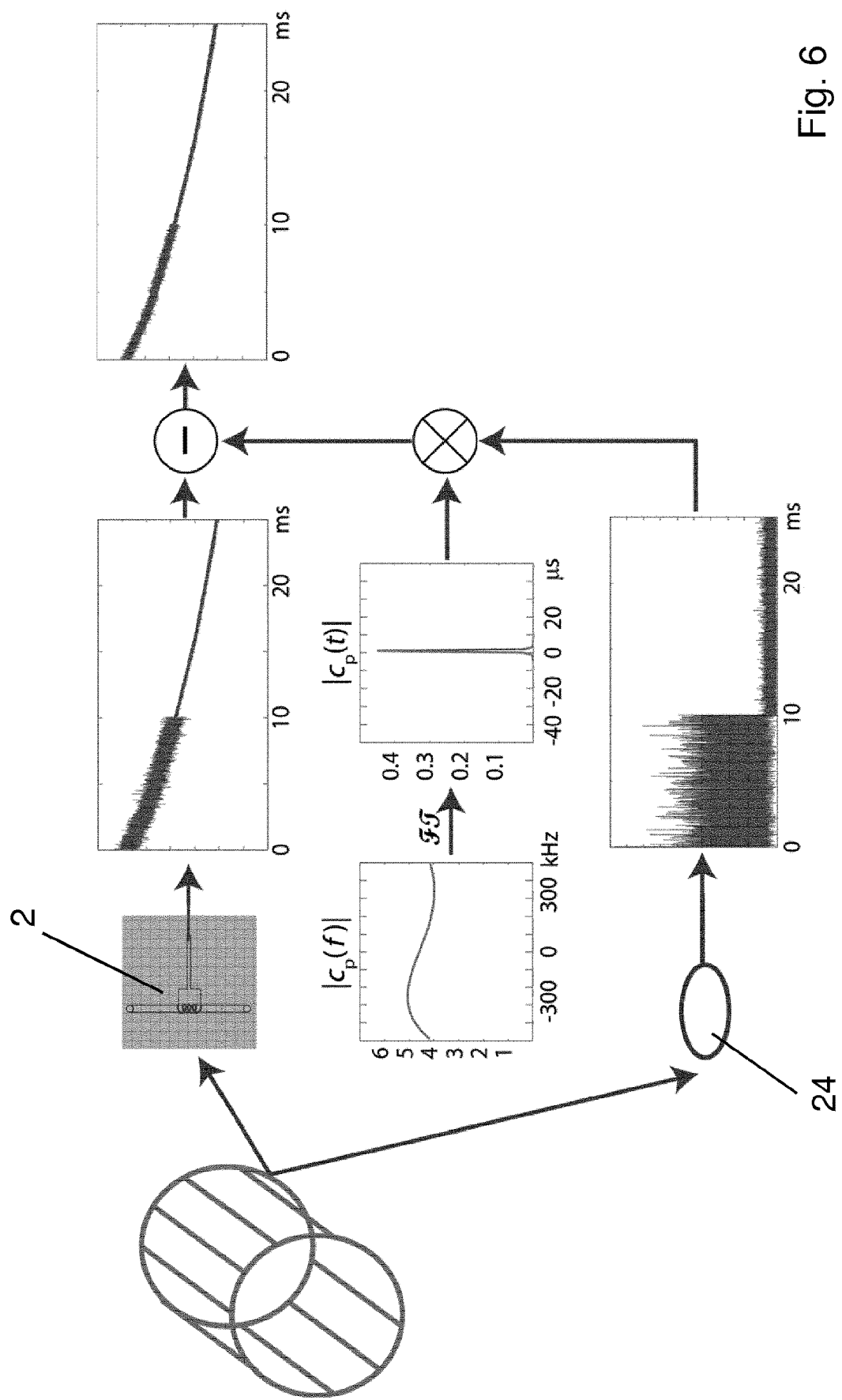
FIG. 6 shows a signal processing pathway for active noise cancelling.

FIG. 6 shows a schematic of an advantageous signal processing pathway for active noise cancelling. The noise signal emitted by the power amplifier is measured by the pickup or a similar coupler concurrently with the NMR signal of the field probe 2. In order to subtract this noise signal as it is coupled to the NMR signal of the field probe, the coupling to each individual probe has to be estimated, preferentially frequency resolved. This coupling is then applied to the signal acquired, preferentially by a representation as a time domain kernel, in order to produce an estimate of the noise signal as acquired on top of the signal acquired from the NMR field probe. Finally this signal is subtracted from the signal acquired concurrently from each probe in order to suppress this noise contribution.

FIG. 7 shows the reduction of signal variance achieved in an experimental embodiment of the active noise suppression approach. Blue represents the signal variance without noise suppression, red with suppression of the noise using the signal of one pick-up loop. Green shows the signal variance in each channel when using two independent noise signal estimates gained from a second pick up channel. The matrix colorplots below show the magnitude of the correlation among the probes' channels before and after denoising with one pickup. It can be seen that the noise parts correlating with the pick-up signal (PU) could be removed. This shows that in fact there is a second, independent noise source present in the system beside the power amplifier, most probably stemming from a non-linear process in the RF coil under high RF power stress.

Figure 8:
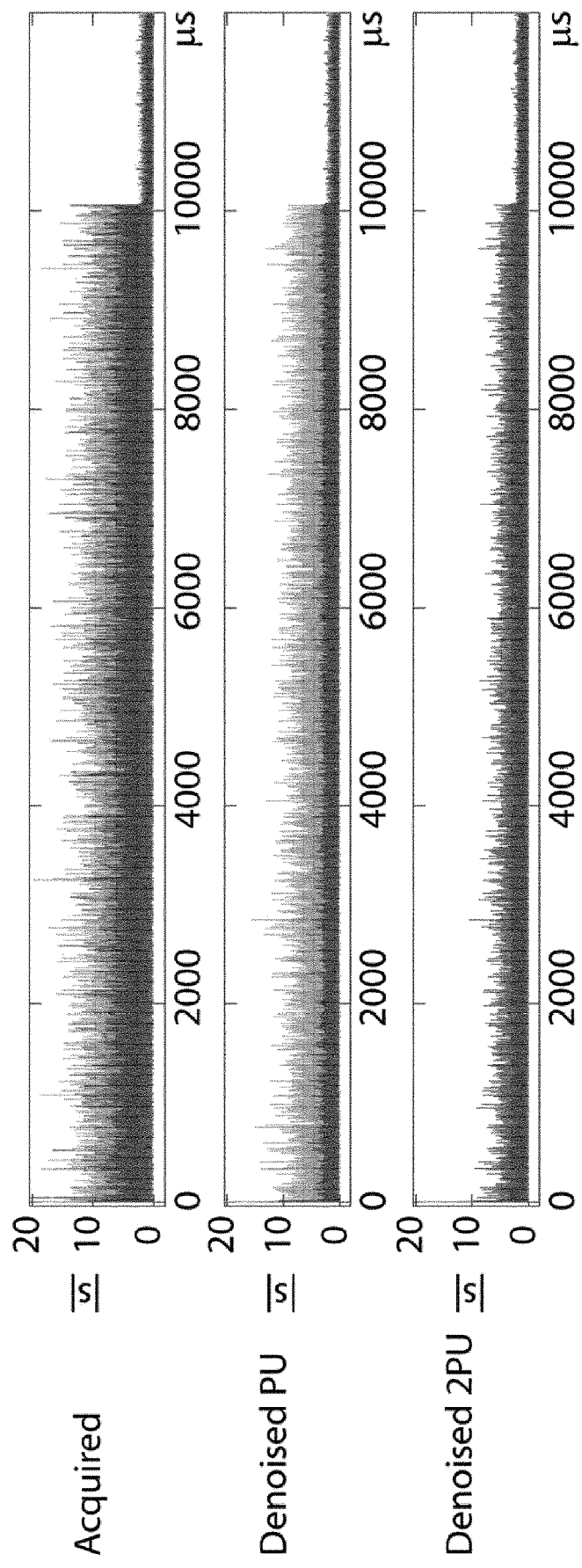
FIG. 8 shows the time domain signals corresponding to the embodiments of FIG. 7.

FIG. 8 shows the time domain signal corresponding to FIG. 7 showing the effect of active noise suppression with one and two independent acquisitions of the power RF signal.

Figure 9:
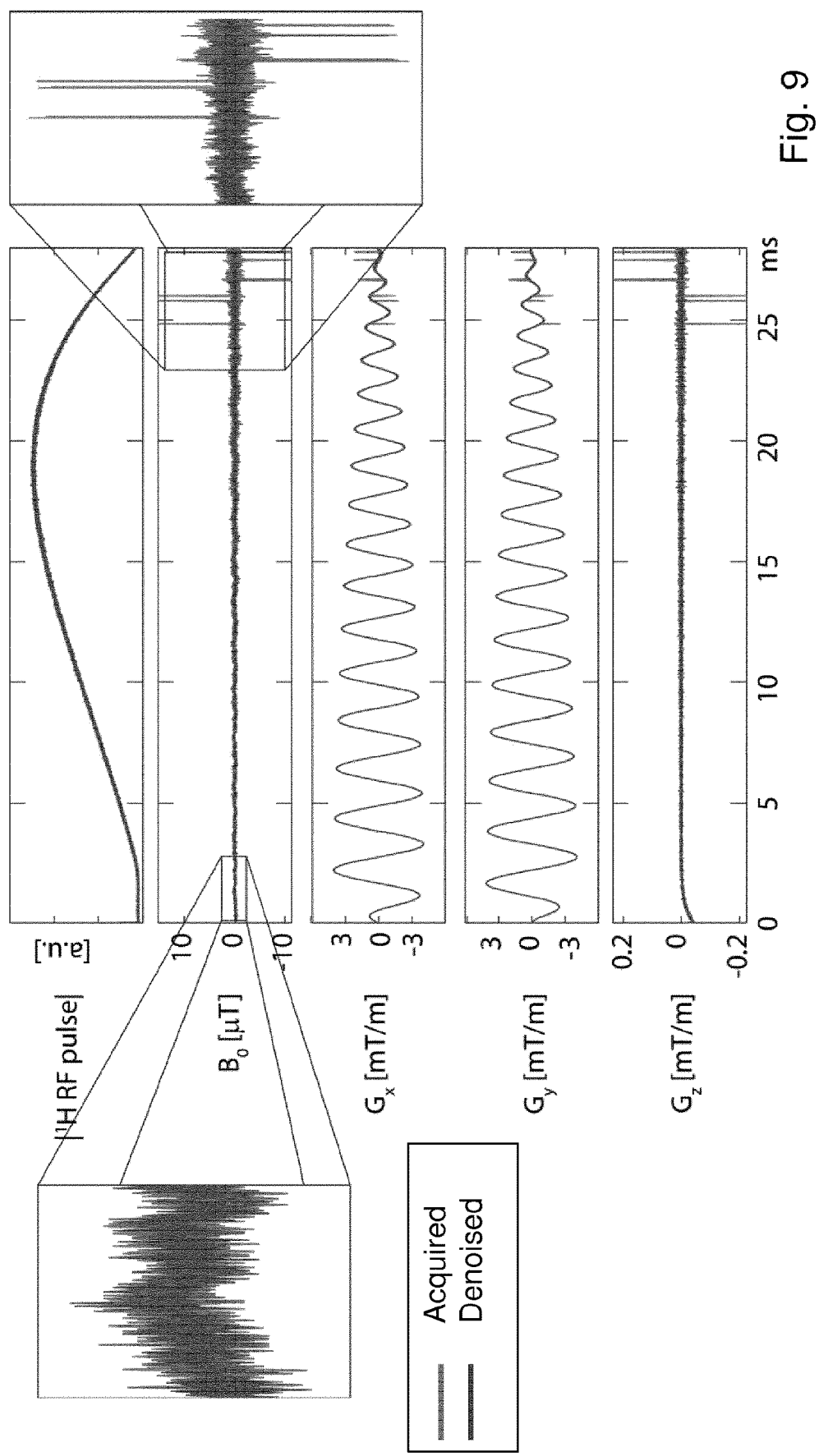
FIG. 9 shows the effect of active denoising on actually acquired time courses of the magnetic fields as measured by field probes and decomposed onto the spatially harmonic terms up to first order.

FIG. 9 shows the effect of active denoising on the actually acquired time courses of the magnetic fields as measured by the field probes and decomposed onto the spatially harmonic terms up to first order. It can be seen that the apparent noise on the field measurement during RF power transmission pulses could be halved in magnitude.

Figure 10:
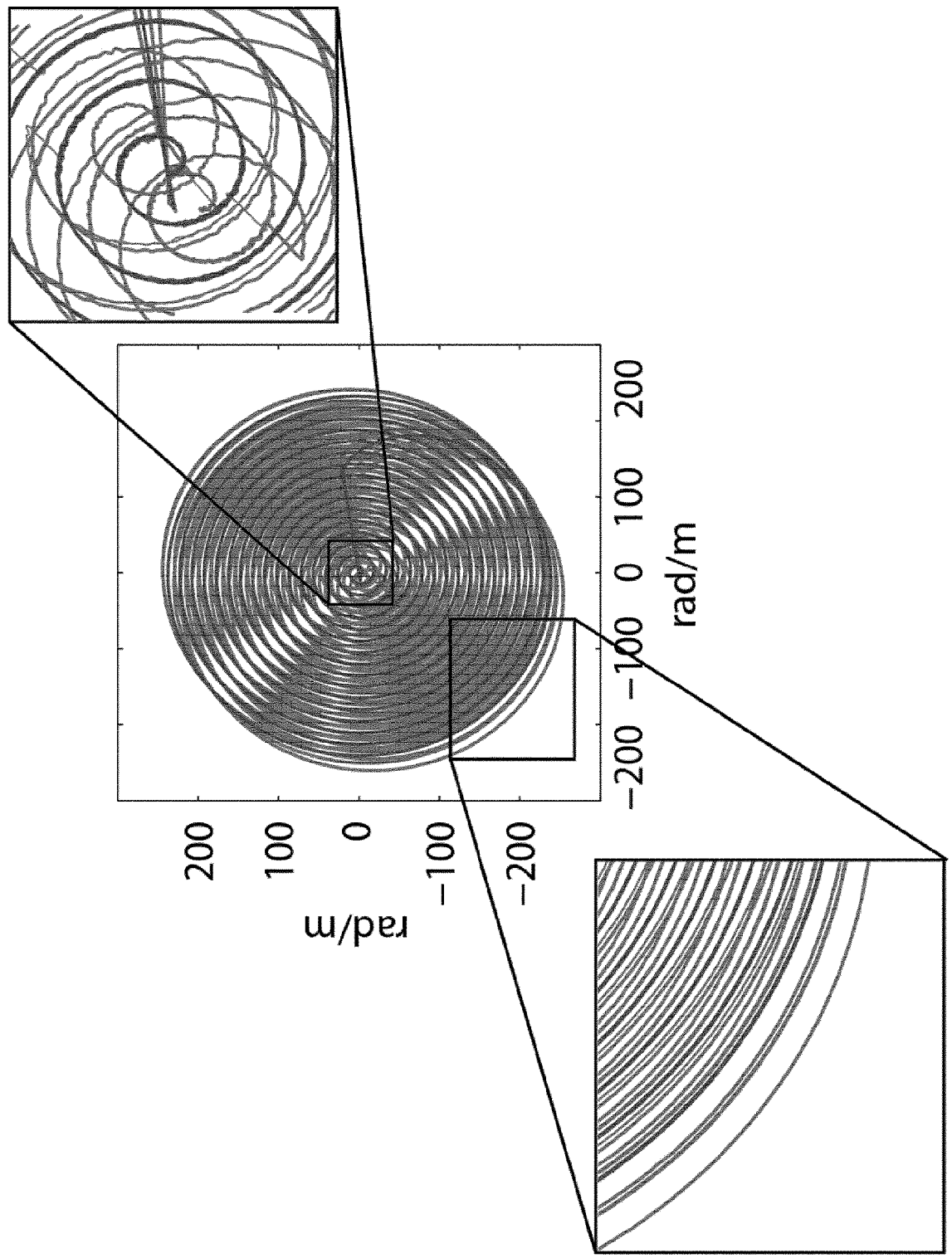
FIG. 10 shows the effect of active denoising on the k-space trajectory as measured by the field probe array.

FIG. 10 shows the effect of the denoising on the k-space trajectory as measured by the field probe array. As seen the noise is strongly reduced and also errors in the involved phase unwrapping procedure of the phase evolution found in each field probe—resulting in jumps in the k-space trajectory—are avoided.

Figure 11:
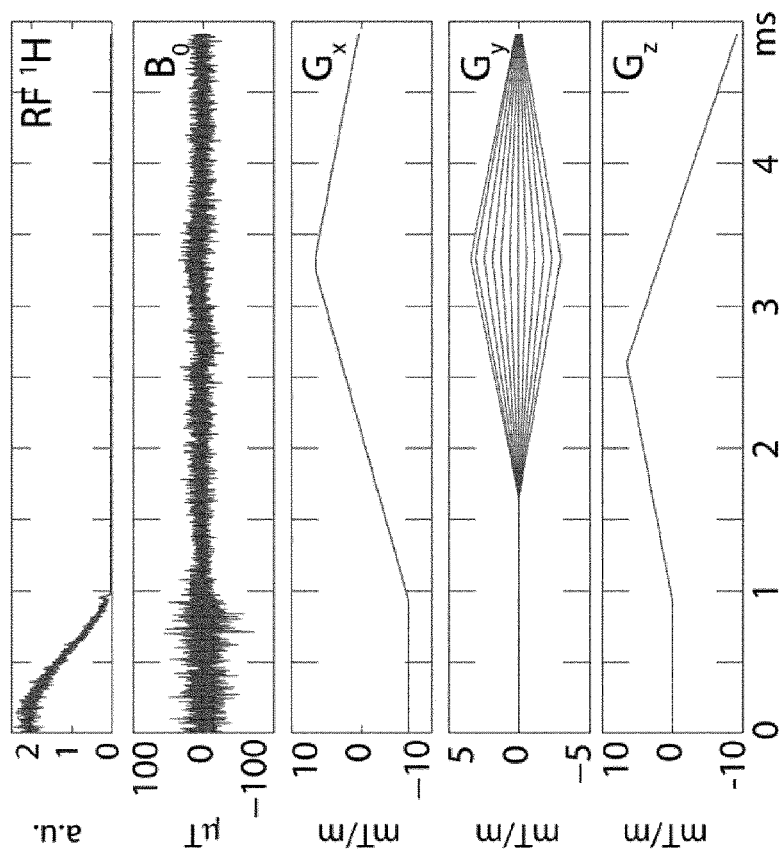
FIG. 11 shows the effect of noise suppression during the excitation phase of a standard Cartesian gradient echo sequence.

FIG. 11 shows the effect of noise suppression during the excitation phase of a standard Cartesian gradient echo sequence. The graphs on the left show a zoomed version during the excitation of the slice (starting from the magnetic centre of the pulse). The right column shows the field evolution from the magnetic centre of the pulse till the end of the read-out. Several shots of the acquisition are overlayed to show the involved variance on the measurement.

Figure 12:
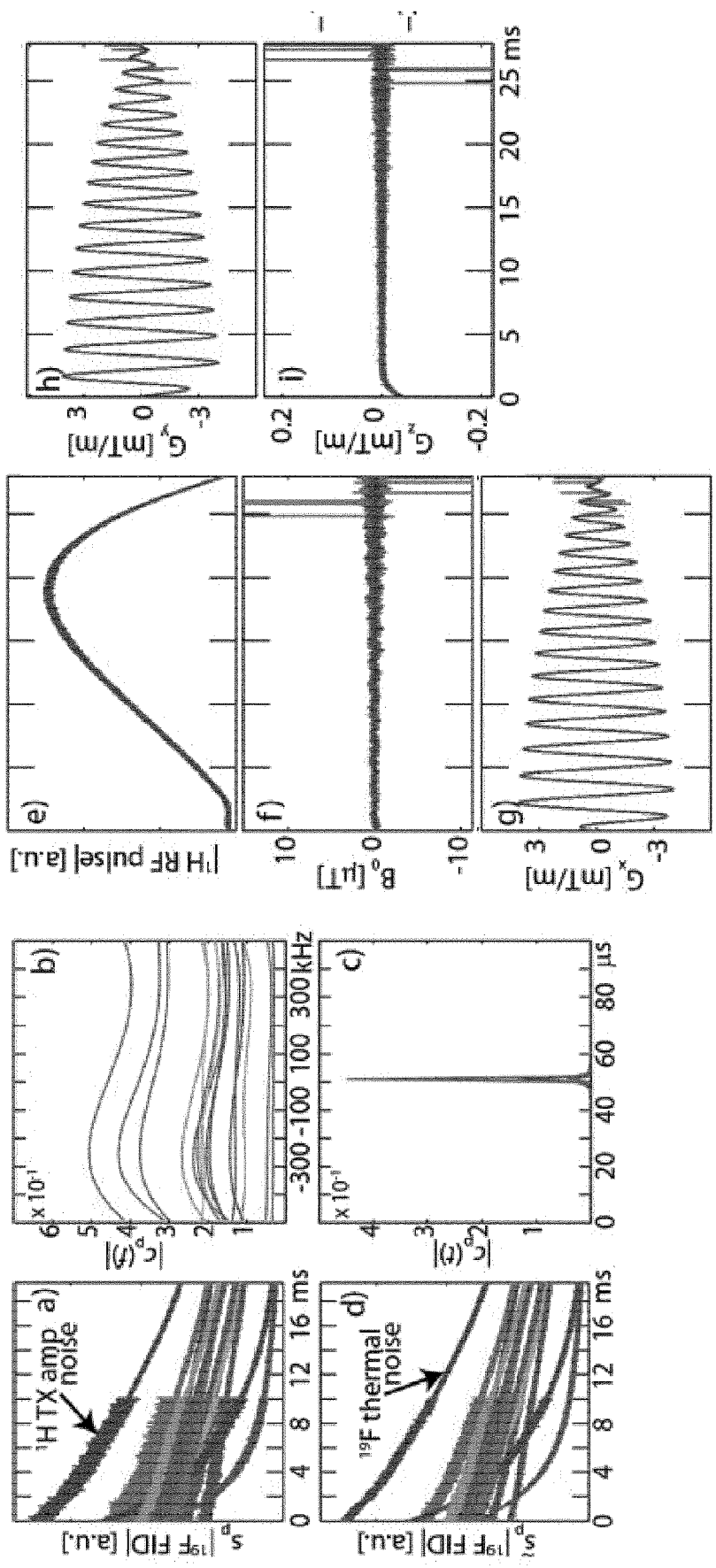
FIG. 12 shows a) FIDs with TX amplifier noise, b) spectrum of relative weights of the noise coupling, c) resulting filter; d) FIDs with subtracted noise, e) monitored RF pulse, and f) to i) fields.

FIG. 12 shows: a) FIDs with TX amplifier noise, b) the spectrum of relative weights of the noise coupling and c) shows the resulting filter. Panel d) shows FIDs after noise subtraction, e) shows the monitored RF pulse, and traces f) to i) show the field components $B_0$, $G_x$, $G_y$ and $G_z$.

EXAMPLE

Field Monitoring During High-Power Transmission Pulses: a Digital Noise Cancelling Approach Introduction Introduction: Recordings of magnetic fields produced by gradient systems, main magnets or induced by the sample have been shown to greatly enhance the results and robustness of MR acquisitions by post-correction [1], prospective field feed-back approaches [2] or by serving as basis for enhanced system calibrations. Recently, the concurrent recording of RF pulse waveforms along with low-frequency field measurements has been introduced delivering the full information about the sequence as performed by the scanner [3]. The signals of the 19F NMR based field sensors could be acquired without noticeable distortion or saturation induced by the high power pulses emitted by the scanner by use of narrowband filters and high dynamic range receiver chains (FIG. 4). Further, the RF pulse waveform could be acquired along using the same physical broad-band receivers. While the high power signal emitted in the $^1$H band can be kept from affecting the field measurement in the $^{19}$F band it was found that the noise floor in the $^{19}$F band is significantly increased by the broadband noise and spur levels found at the output of typical high-power RF amplifiers which is coupled into the field probes. Therefore, stop-band filters had to be previously introduced into the transmission path of the scanner in order to stop the noise at the fluorine frequency. Although such filters are common pieces of technology they nevertheless introduce additional delays and losses and can introduce thermal drift behaviour. In this work we present an approach digitally compensating the noise contribution from the power amplifier which obsoletes largely the high power filters and most importantly allows measuring the system in its native configuration.

The noise at the output of the power amplifier can be regarded as an externally induced signal $\eta_{amp}(t)$ coupled into the field probes p with a complex weight $c_p(\omega)$ onto the FID. These coupling constants are considered as frequency dependent since some of the involved components such as tuned coils and signal conditioning filters are narrowband. Therefore the signal present in the probe is in Fourier domain:

$$s_p(\omega)=\text{FID}(\omega)+c_p(\omega)\cdot\eta_{amp}(\omega)+\eta_{thermal}(\omega)$$

Recording the signal of a pick-up loop concurrently with the field probe data yields $s_{pu}(t)\propto\eta_{amp}(t)$ and can hence be used to subtract the noise of the power amplifier out of the FIDs. The corresponding complex weightings are obtained from the noise covariance in a calibration acquisition in which an $^1$H RF pulse but no FID is excited in the probes:

$$c_p=<s_{pu},s_p>/<s_{pu},s_{pu}>$$

where $<,>$ denotes a covariance.

The frequency dependency is obtained in Fourier domain binned to 100 equally wide bands. The spectra of the weightings are then fitted by a fourth order polynomial and transposed into a 100 tap FIR filter $c_p(t)$. Finally the noise signal acquired in the pickup is filtered and subtracted from the FIDs signals of the field probes in order to suppress the power amplifier noise:

$$\tilde{s}_p(t)=s_p(t)-s_{pu}(t)\oplus c_p(t)$$

Methods

Experiments were performed on a 7T human whole body system (Philips Healthcare, Cleveland, Ohio). The signals from the $^{19}$F field probes and the pick-up loop were acquired with a stand-alone field camera system 3 which simultaneously records the $^{19}$F and the $^1$H band on each of its 16 channels. The field probes were equipped with gradient switching compatible RF shields and notch filters adjusting the dynamic range of the proton and the fluorine band to similar levels (FIG. 4).

Results

FIG. 12a) shows the FIDs acquired with strongly increased noise floor during a 10 ms block pulse at the beginning. The relative weights between the probes and the pickup and the resulting filters are plotted in b) and c). As d) shows, the noise could be suppressed by 6 dB and more in most channels. FIGS. 12e)-i) and FIG. 10 show the recording of the full sequence (RF, B0, gradients and excitation k-space trajectory) of a pencil-beam navigator pulse with noise subtraction (blue) and without (red) for 20 interleaves plotted on top of each other. As seen, the increased noise level of the RD propagates into the measured fields and can even cause critical wrapping errors if not subtracted. These wrapping errors lead to large errors and inconsistencies in the k-space trajectory as seen by the high variance between the red k-space trajectories among different interleaves not present in the blue curves.

Discussion

The achieved noise suppression allows monitoring the magnetic field with sufficiently high sensitivity and accuracy even during high power transmission pulses without requiring any adaptations of the MR scanner. This is of particular use to study excitation profiles concurrently with the pulse or for obtaining very accurate information about the imaging signal phase evolution which is typically referenced to the magnetic centre of the excitation pulse previously not assessable to the monitoring. Further, gradient and higher order field evolutions can be acquired along with RF pulses with highly stringent relative timing. Thereby the full information about the sequence is obtained as it is performed by the native scanner without any modifications potentially introducing delays, shifts or drifts. The remnant additional noise during the RF pulse was found to be not correlated with the signal in the pick-up loop. Therefore it is believed that they stem from different sources. These sources are presumably based on non-linear behaviours of the involved components carrying high RF currents and can be further reduced by capturing them with more dedicated pick-ups as experimentally confirmed.

REFERENCES

[1] Barmet C, De Zanche N, Pruessmann K P. *Spatiotemporal magnetic field monitoring for MR*. Magn Reson Med 60(1), 187-197, 2008.

[2] Duerst Y, Wilm B J, Dietrich B E, Vannesjo S J, Barmet C, Schmid T, Brunner D O, Pruessmann K P. *Real-time feedback for spatiotemporal field stabilization in MR systems*. Magn Reson Med 73(2), 884-893, 2015.

[3] B. E. Dietrich, D. O. Brunner, C. Barnet, B. J. Wilm, and K. P. Pruessmann. *A stand-alone system for concurrent gradient and RF sequence monitoring*. In: Proc Int Soc Magn Reson Med. (2012) Melbourne, Australia, p 700.

The invention claimed is:

1. A magnetic resonance (MR) system comprising a main magnetic field and an RF power amplifier for generating an RF field in a first RF band, the arrangement further comprising at least one magnetic field probe, said magnetic field probe comprising a MR active probe substance, means for pulsed MR excitation of said probe substance in a second RF band and means for receiving a probe MR signal in the second RF band generated by said probe substance, characterized by further comprising means for recording output signal of the RF power amplifier in said second RF band, and means for subtracting from said probe MR signal an interfering signal contribution contained in said recorded RF amplifier output signal, wherein the system is utilized by subtracting an interfering signal contribution contained in said RF amplifier output signal from a probe MR signal acquired from one of said magnetic field probes, and wherein the system is utilized such that said interfering signal contribution is obtained by weighting said recorded RF amplifier output signal with a predefined, spectrally non-constant weighting function or filter.

2. The magnetic resonance system according to claim 1, wherein said recording means comprise at least one pick-up loop or antenna.

3. The magnetic resonance system according to claim 1, wherein said recording means comprise at least one coupling means connected to an output port of the RF power amplifier or to a transmitter coil element of the RF power amplifier.

4. The magnetic resonance system according to claim 1, wherein said recording means comprise a further one of said magnetic field probes.

5. The magnetic resonance system according to claim 1, wherein said magnetic field probes further comprise a shield against external high-frequency electromagnetic field irradiation, said shield substantially surrounding the magnetic field probe, said shield having at least one RF contact to the RF ground of the field probe.

6. The magnetic resonance system according to claim 1, wherein the system is utilized such that said interfering signal contribution to be subtracted from a probe MR signal acquired from one of said magnetic field probes is obtained from a further one of said magnetic field probes.

7. The magnetic resonance system according to claim 6, wherein the system is utilized such that said interfering signal contribution is acquired at times when the probe substance of said further magnetic field probe is not generating any probe MR signal.

8. The magnetic resonance system according to claim 3, wherein the system is utilized for estimating relative coupling factors from at least one transmitter to at least one probe MR signal acquired from a magnetic field probe by cross correlating an interfering signal contribution acquired from any one of said transmitters coil elements with the probe MR signal acquired from any one of said magnetic field probes.

9. The magnetic resonance system according to claim 2, wherein said magnetic field probes further comprise a shield against external high-frequency electromagnetic field irradiation, said shield substantially surrounding the magnetic field probe, said shield having at least one RF contact to the RF ground of the field probe.

10. The magnetic resonance system according to claim 3, wherein said magnetic field probes further comprise a shield against external high-frequency electromagnetic field irradiation, said shield substantially surrounding the magnetic field probe, said shield having at least one RF contact to the RF ground of the field probe.

11. The magnetic resonance system according to claim 4, wherein said magnetic field probes further comprise a shield against external high-frequency electromagnetic field irradiation, said shield substantially surrounding the magnetic field probe, said shield having at least one RF contact to the RF ground of the field probe.

12. The magnetic resonance system according to claim 2, wherein the system is utilized by subtracting an interfering signal contribution contained in said RF amplifier output signal from a probe MR signal acquired from one of said magnetic field probes.

13. The magnetic resonance system according to claim 3, wherein the system is utilized by subtracting an interfering signal contribution contained in said RF amplifier output signal from a probe MR signal acquired from one of said magnetic field probes.

14. The magnetic resonance system according to claim 4, wherein the system is utilized by subtracting an interfering signal contribution contained in said RF amplifier output signal from a probe MR signal acquired from one of said magnetic field probes.

15. The magnetic resonance system according to claim 5, wherein the system is utilized by subtracting an interfering signal contribution contained in said RF amplifier output signal from a probe MR signal acquired from one of said magnetic field probes.

\* \* \* \* \*

UNITED STATES PATENT AND TRADEMARK OFFICE
CERTIFICATE OF CORRECTION

PATENT NO.       : 10,901,055 B2            Page 1 of 1
APPLICATION NO.  : 15/573881
DATED            : January 26, 2021
INVENTOR(S)      : David Brunner et al.

It is certified that error appears in the above-identified patent and that said Letters Patent is hereby corrected as shown below:

In the Specification

Column 8, Line 1, delete "RD" and insert --FID--

Column 8, Line 40, delete "Barnet" and insert --Barmet--

In the Claims

Column 8, Claim 1, Line 53, after "recording" insert --an--

Signed and Sealed this
Sixth Day of April, 2021

Drew Hirshfeld
*Performing the Functions and Duties of the
Under Secretary of Commerce for Intellectual Property and
Director of the United States Patent and Trademark Office*